(12) United States Patent
Stuewe et al.

(10) Patent No.: US 12,253,869 B2
(45) Date of Patent: Mar. 18, 2025

(54) FLEXIBLE SERVER CHASSIS WITH ALTERNATIVE POWER SUPPLY LOCATIONS AND DIRECTIONS

(71) Applicant: DELL PRODUCTS, LP, Round Rock, TX (US)

(72) Inventors: John R. Stuewe, Round Rock, TX (US); Walt R. Carver, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 688 days.

(21) Appl. No.: 17/242,567

(22) Filed: Apr. 28, 2021

(65) Prior Publication Data

US 2022/0354027 A1 Nov. 3, 2022

(51) Int. Cl.
*G05D 3/12* (2006.01)

(52) U.S. Cl.
CPC ...................................... *G05D 3/12* (2013.01)

(58) Field of Classification Search
CPC ......... G05D 3/12; H05K 7/20836; G06F 1/20
See application file for complete search history.

(56) References Cited

U.S. PATENT DOCUMENTS

| | | | |
|---|---|---|---|
| 6,215,664 B1 | 4/2001 | Hernandez et al. | |
| 8,823,531 B1 * | 9/2014 | McCleary | G06F 1/206 165/146 |
| 9,474,181 B2 | 10/2016 | Bailey et al. | |
| 9,730,364 B2 * | 8/2017 | Mundt | F04D 19/007 |
| 10,010,014 B1 * | 6/2018 | Lachapelle | H05K 7/20718 |
| 11,758,684 B1 * | 9/2023 | Kalani | H05K 7/20745 361/695 |
| 2006/0152891 A1 * | 7/2006 | Jreij | H05K 7/20209 361/676 |
| 2007/0081888 A1 * | 4/2007 | Harrison | F04D 19/007 257/E23.099 |
| 2011/0218790 A1 * | 9/2011 | Algaonkar | G01K 11/32 702/65 |
| 2013/0226481 A1 * | 8/2013 | Berke | G06F 15/177 361/679.02 |
| 2014/0078668 A1 * | 3/2014 | Goulden | G06F 1/20 454/239 |

(Continued)

*Primary Examiner* — Robert E Fennema
*Assistant Examiner* — Vi N Tran
(74) *Attorney, Agent, or Firm* — Larson Newman, LLP

(57) ABSTRACT

An information handling system includes a chassis having a cold aisle edge and a hot aisle edge, one or more devices inserted within the cold aisle edge, a power supply unit, and a baseboard management controller (BMC). The BMC determines whether a power supply cooling fan of the power supply unit installed within the information handling system has a fixed airflow direction or changeable airflow direction. In response to the power supply cooling fan having a fixed airflow direction, the BMC determines a configuration of the information handling system. The BMC determines a power supply cooling fan orientation of a power supply cooling fan within the power supply unit, and whether the power supply cooling fan orientation corresponds to the configuration of the information handling system. If not, the BMC provides an alert message to an individual associated with the information handling system.

16 Claims, 5 Drawing Sheets

(56) References Cited

U.S. PATENT DOCUMENTS

| | | | |
|---|---|---|---|
| 2014/0160656 A1* | 6/2014 | Morrison | G06F 1/1632 |
| | | | 361/679.21 |
| 2017/0212561 A1* | 7/2017 | Ku | G06F 1/20 |
| 2018/0314197 A1* | 11/2018 | Konishi | G03G 15/2039 |
| 2019/0037730 A1* | 1/2019 | Gao | H05K 7/20281 |
| 2019/0339753 A1* | 11/2019 | Shabbir | H05K 7/20136 |
| 2022/0210943 A1* | 6/2022 | Chang | H05K 7/1492 |

* cited by examiner

FLEXIBLE SERVER CHASSIS WITH ALTERNATIVE POWER SUPPLY LOCATIONS AND DIRECTIONS

FIELD OF THE DISCLOSURE

The present disclosure generally relates to information handling systems, and more particularly relates to a flexible server chassis with alternative power supply locations and directions.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a chassis, one or more devices, a power supply unit, and a baseboard management controller. The chassis includes a cold aisle edge and a hot aisle edge, and the devices are inserted within the cold aisle edge. The power supply unit may provide power to the one or more devices. The baseboard management controller (BMC) may determine whether a power supply cooling fan of the power supply unit installed within the information handling system has a fixed airflow direction or changeable airflow direction. In response to the power supply cooling fan having a fixed airflow direction, the BMC may determine a configuration of the information handling system. The BMC may determine a power supply cooling fan orientation of a power supply cooling fan within the power supply unit, and whether the power supply cooling fan orientation corresponds to the configuration of the information handling system. In response to the power supply cooling fan orientation corresponding to the configuration of the information handling system, the BMC may provide an airflow within the power supply unit. In response to the power supply cooling fan orientation not corresponding to the configuration of the information handling system, the BMC may provide an alert message to an individual associated with the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
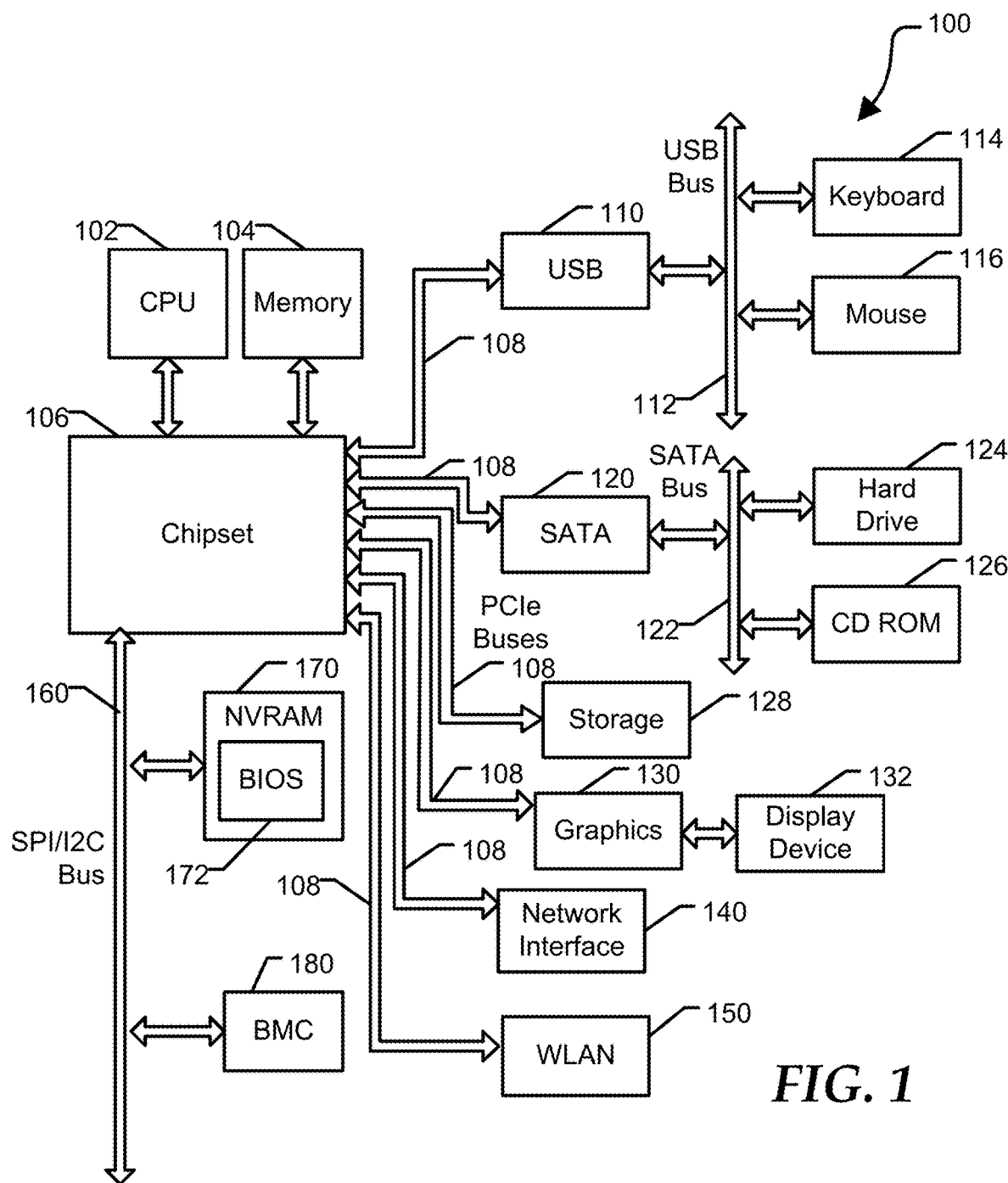
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
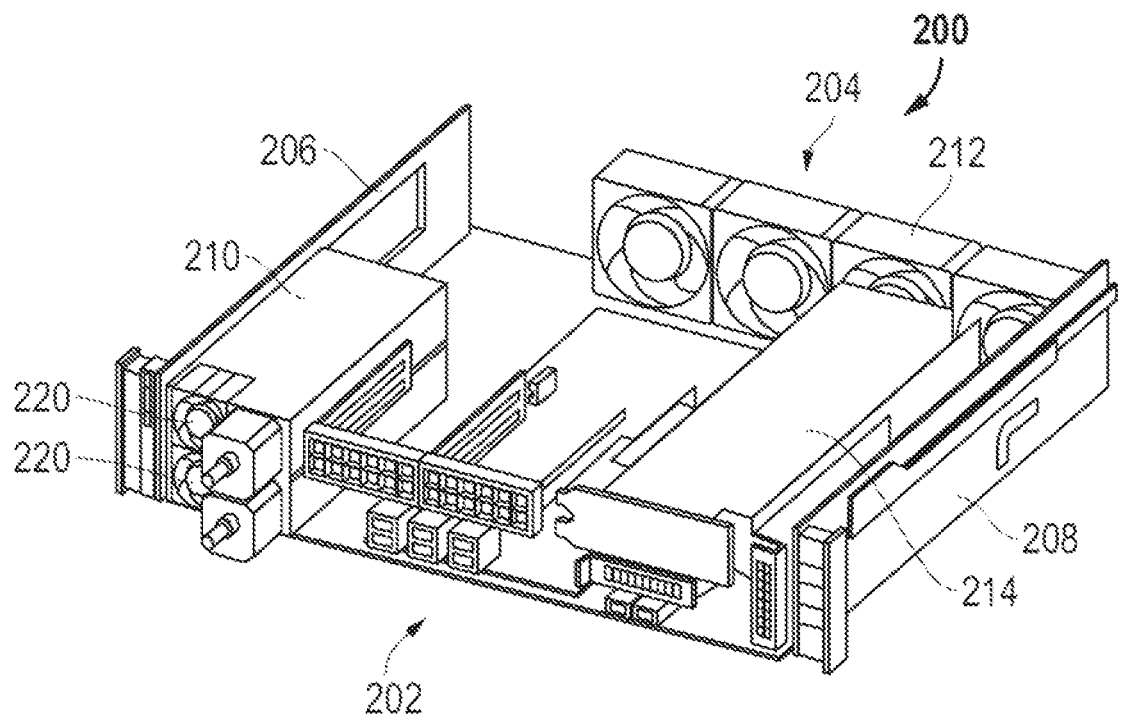
FIG. 2 is a diagram of a server with a power supply unit in a cold aisle of the server according to at least one embodiment of the disclosure.

In an example, information handling system 100 may be any suitable device including, but not limited to, a component 214 within a server 200 of FIG. 2. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

Figure 3:
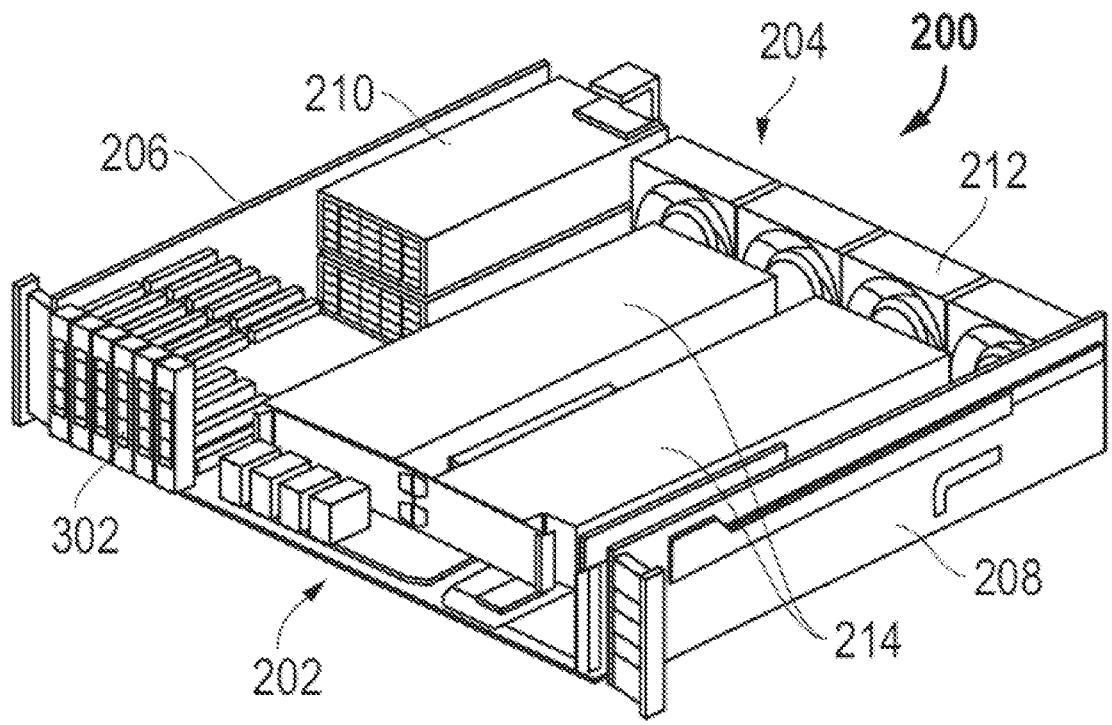
FIG. 3 is a diagram of a server with a power supply unit in a hot aisle of the server according to at least one embodiment of the disclosure.

FIGS. 2 and 3 illustrate a server 200 according to at least one embodiment of the disclosure. Server 200 includes a chassis having a front or cold aisle edge 202, a back or hot aisle edge 204, and side edges 206 and 208. In an example, server 200 may be inserted within a server rack, which in turn may be located within a data center. The data center may include multiple rows of server racks with cold air being provided in one aisle, drawn through the server rack, and provided out of the server rack into a hot aisle. Server 200 may hold a power supply unit 210, multiple system cooling fans 212, and one or more other components 214. In an example, server may include additional components over those shown in FIG. 2 without varying from the scope of this disclosure.

Power supply unit 210 may be utilized to provide power to system cooling fans 212 and the other components 214 within the server. Power supply unit 210 may include one or more power supply cooling fans 220 to provide cold airflow through the power supply unit. In an example, system cooling fans 212 may pull the cold air from the cold aisle through server 200 and out of the server to the hot aisle.

In previous data centers, a server may have cabled connections in the hot aisle or at the rear of the server or server. Cabled connections may be any suitable devices including, but not limited to, power supply units, input/output (I/O) devices, and networking devices. In some environments, users may want access to I/O and networking cables from the front of a server. Depending on the environment that server 200 is inserted, power supply unit 210 may need to be in the cold aisle or in the hot aisle. In previous information handling systems, one server would be needed when power supply unit 210 is in the cold aisle and a different server would be needed when the power supply unit is in the hot aisle. Server 200 improves an information handling system by the same server may accommodate power supply unit 210 in either the cold aisle or the hot aisle.

In an example, system cooling fans 212 and the other components 214 may be positioned within server 200 so that power supply units 210 may be located in either cold aisle edge 202 or the hot aisle edge 204 without changing the positions of the cooling fans and the other components in the server. In one configuration of server 200, power supply unit 210 is located in cold aisle edge 202 as shown in FIG. 2. In another configuration, power supply unit 210 is located in hot aisle edge 204 as shown in FIG. 3. In an example, when power supply unit 210 is located in hot aisle edge 204, additional components 302 may be inserted within cold aisle edge 202.

Figure 4:
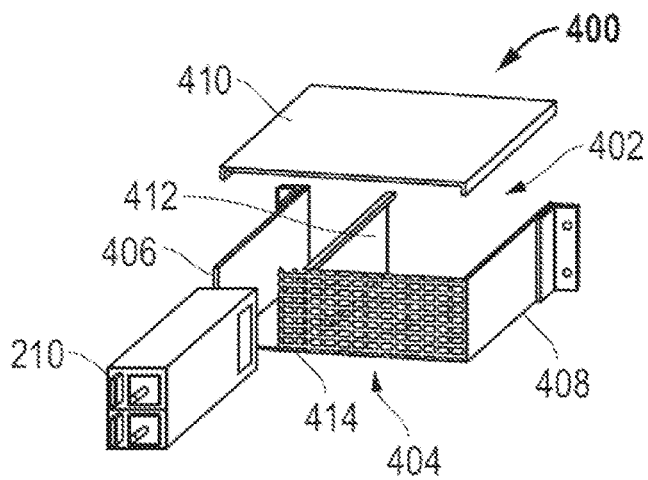
FIG. 4 is an exploded view of a server frame and a power supply unit being inserted within a hot aisle edge of the server according to at least one embodiment of the disclosure.

FIG. 4 illustrates an exploded view of a server 400 and power supply unit 210 in a first configuration according to at least one embodiment of the disclosure. Server 400 includes a cold aisle edge 402, a hot aisle edge 404, side edges 406 and 408, a lid 410, a divider panel 412, and a vent cover 414. In an example, power supply unit 210 may be inserted within server 400 from either cold aisle edge 402 or hot aisle edge 404. When power supply unit 210 is inserted from hot aisle edge 404, power control and power outputs from the power supply unit may be on the opposite side of server 400 as compared to I/O nodes inserted from cold aisle edge 402. In an example, a cable channel may be formed between power supply unit 210 and divider panel 412. The cable channel may also be formed between divider panel 412 and vent cover 414. In certain examples, power cables from power supply unit 210 may be routed along the cable channel between power supply unit 210 and divider panel 412 and in between the divider panel and vent cover 414. The power cables may provide power from power supply unit 210 to other components in server 400.

Figure 5:
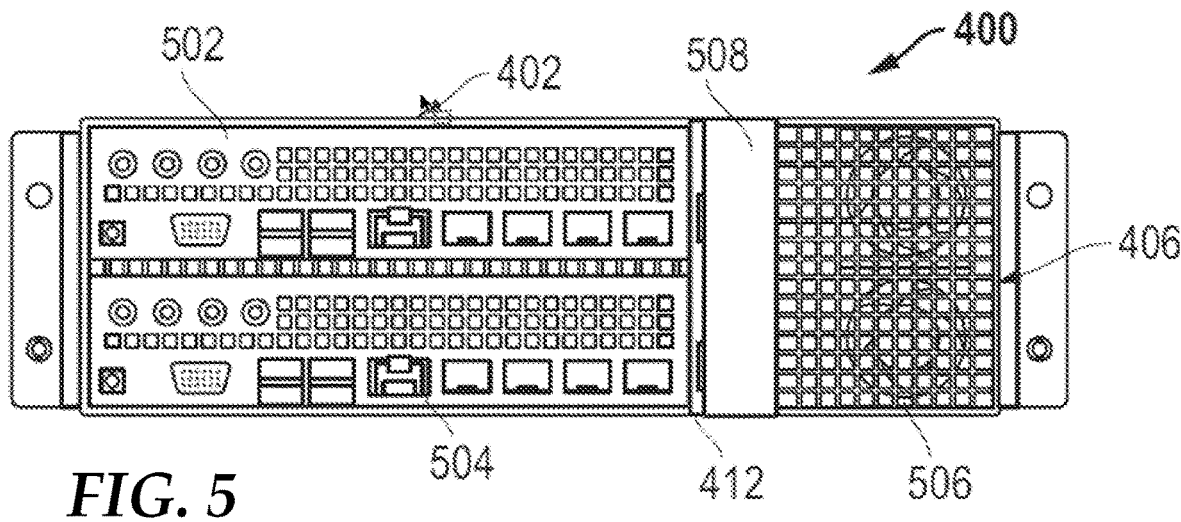
FIG. 5 is a diagram of an edge of a server facing a cold aisle according to at least one embodiment of the disclosure.
Figure 6:
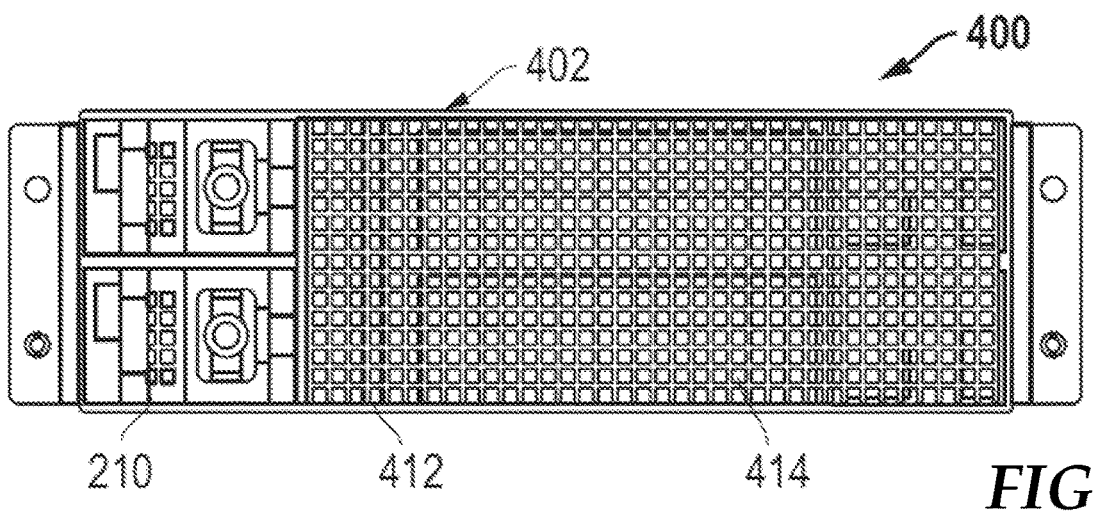
FIG. 6 is a diagram of an edge of a server facing a hot aisle according to at least one embodiment of the disclosure.

FIGS. 5 and 6 illustrate different views of server 400 according to at least one embodiment of the disclosure. Referring now to FIG. 5, server 400 may be configured with components or devices 502 and 504 located within cold aisle edge 402 and power supply unit 210 located within hot aisle edge 404. In an example, power supply unit 210 and vent cover 414 may combine to extend across the entire hot aisle edge of server 400 as shown in FIG. 6. Devices 502 and 504 may be any suitable type of compute nodes including, but not limited to, I/O nodes and networking nodes. Based on devices 502 and 504 and power supply unit 210 being inserted from opposite edges of server 400, the power output of the power supply unit is on the opposite side of the server than the power ports of the devices.

In certain examples, a length of power supply unit 210 may be shorter than a depth of server 400 so that the power cables may extend from the back of the power supply and be routed along the cable channel to the power ports of devices 502 and 504. In this configuration of server 400, a vent cover 506 and blank 508 may be placed in cold aisle edge 402 in between divider panel 412 and side edge 406. In an example, vent cover 506 and blank 508 may fill a gap within cold aisle edge 402 that power supply unit 210 would occupy if the power supply unit was inserted within the cold aisle edge.

In response to power supply unit 210 being inserted within server 400, a processor, such as BMC 180 of FIG. 1, of server may perform one or more suitable operations to determine the configuration of the server and a type of power supply unit installed within the server. The type of power supply unit may be any suitable type including, but not limited to, a power supply unit with power supply cooling fans 220 that can change an airflow direction within the power supply unit, and a power supply unit with power supply cooling fans that can only direct airflow in a single direction within the power supply unit. In an example, different sets of internal cables may be needed based on a cable length needed to connect the output power from power supply unit 210 to the power ports of devices 502 and 504. In certain examples each set of cables may be slightly different and the processor may detect the differences to determine the configuration of server 400. The processor also may detect a type of power supply unit via any other suitable manner including, but not limited to, detecting a model number or a device number stored within power supply unit 210 and detecting characteristics of the power supply unit. In an example, power supply unit 210 may also determine the configuration of server 400 without varying from the scope of this disclosure.

In response to determining the type of power supply unit 210, processor may perform any suitable operation to detect whether a different power supply unit is needed based on the configuration of server 400. For example, if power supply unit 210 has a power supply cooling fan 220 that can change airflow directions, the processor may determine that a proper power supply unit is installed within the server. Based on this determination, the processor may configuration power supply cooling fan 220 of power supply unit 210 to direct airflow in a correct direction. In an example, the correct direction of airflow for power supply unit 210 may be from cold aisle edge 402 to hot aisle edge 404 of server 400.

In an example, if power supply unit 210 has a power supply cooling fan 220 that pushes airflow across the power supply unit and the power supply unit is installed in hot aisle edge 404 as in the configuration of server 400 shown in FIGS. 4-6, the processor may determine that a proper power supply unit is installed within the server. If power supply unit 210 has a power supply cooling fan 220 that pulls airflow across the power supply unit and the power supply unit is installed in hot aisle edge 404, the processor may determine that a different power supply unit needs to be installed within the server. In response to power supply unit 210 not having correct airflow, processor may provide an alert to a user of server 400 that a configuration error has occurred. In an example, the alert may be any suitable message including, but not limited to, a message displayed on a screen associated with server 400 and an audio message.

Figure 7:
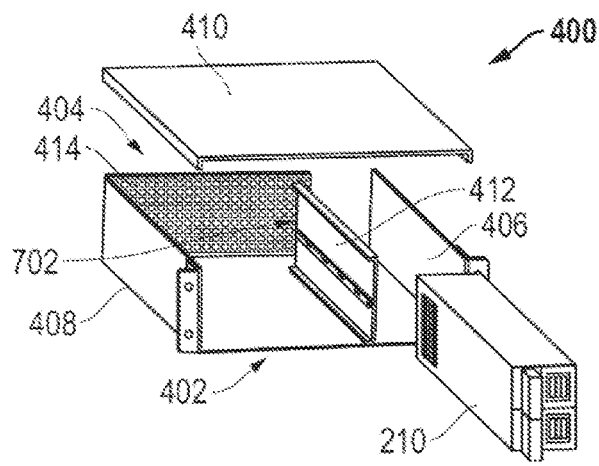
FIG. 7 is an exploded view of a server frame and a power supply unit being inserted within a cold aisle edge of the server according to at least one embodiment of the disclosure.

FIG. 7 illustrates an exploded view of server 400 and power supply unit 210 in a second configuration according to at least one embodiment of the disclosure. In an example, power supply unit 210 may be inserted within server 400 from cold aisle edge 402. When power supply unit 210 is inserted from cold aisle edge 402, power control and power outputs from the power supply unit may be on the same side of server 400 as compared to I/O nodes. In an example, a cable channel 702 may formed between divider panel 412 and vent cover 414. In certain examples, power cables from power supply unit 210 may be routed through cable channel 702 in between divider panel 414 and vent cover 414.

Figure 8:
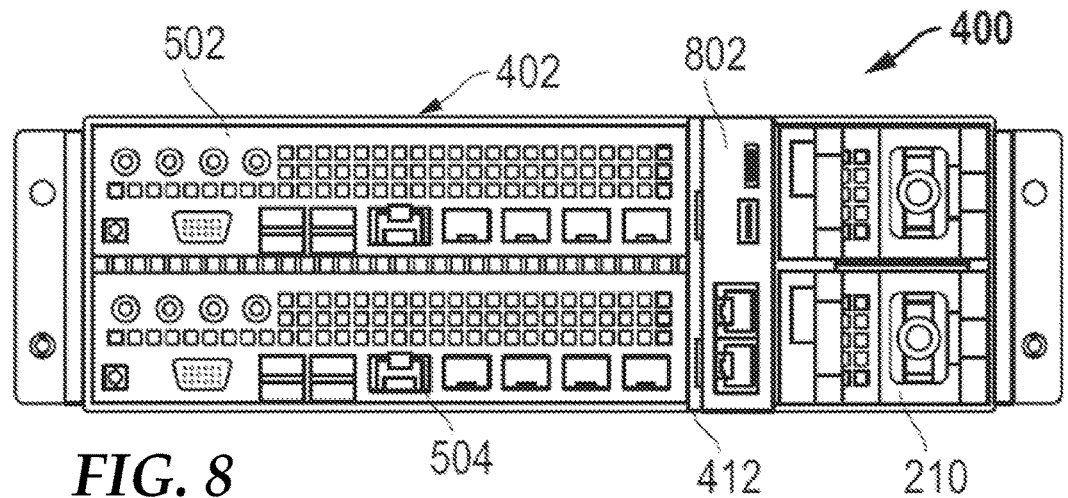
FIG. 8 is a diagram of an edge of a server facing a cold aisle according to at least one embodiment of the disclosure.
Figure 9:
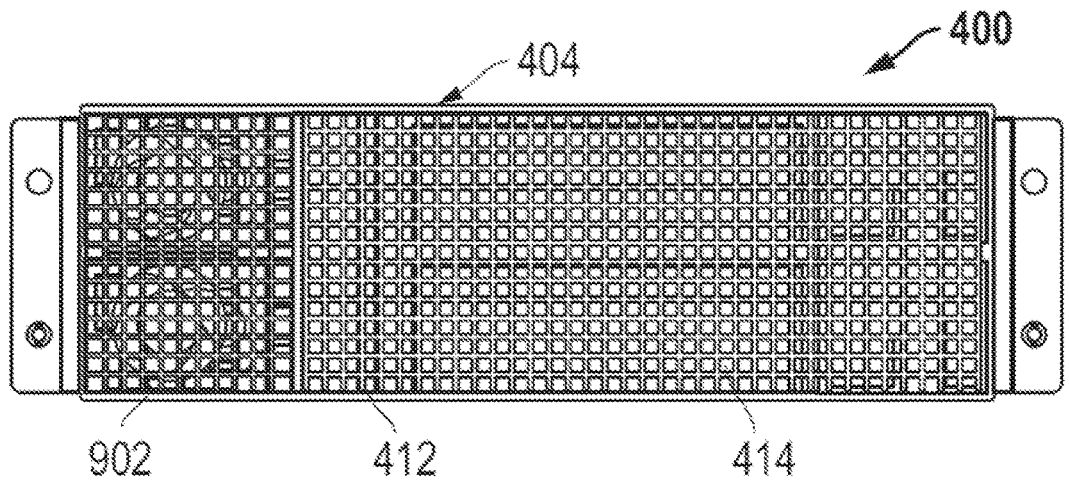
FIG. 9 is a diagram of an edge of a server facing a hot aisle according to at least one embodiment of the disclosure.

FIGS. 8 and 9 illustrate different views of server 400 according to at least one embodiment of the disclosure. Referring now to FIG. 8, server 400 may be configured with components or devices 502 and 504 and power supply unit 210 located within cold aisle edge 402. In an example, a supplemental vent cover 902 and vent cover 414 may combine to extend across the entire hot aisle edge of server 400 as shown in FIG. 9. The supplemental vent cover 902 may be utilized to cover the location designated for power supply unit 210 in hot aisle edge 404. Based on devices 502 and 504 and power supply unit 210 being inserted from the same edge of server 400, the power output of the power supply unit is on the same side of the server as the power ports of the devices.

In the configuration of server 400 with devices 502 and 504 and power supply unit 210 all in cold aisle edge 402, an additional component 802 may be placed in cold aisle edge 402 in between divider panel 412 and the power supply unit. In an example, component 802 may occupy an area within server 400 that power cables would occupy if power supply unit 210 was inserted within hot aisle edge 404.

In response to power supply unit 210 being inserted with server 400, a processor, such as BMC 180 of FIG. 1, may perform one or more suitable operations to determine the configuration of the server and a type of power supply unit installed within the server. For example, the processor may perform the operations stated above with respect to FIGS. 5 and 6 to determine the configuration of server 400 and whether power supply cooling fan 220 of power supply unit 210 is able to provide proper airflow to the power supply unit. Based on the determination, the processor may configured power supply cooling fan 220 of power supply unit 210 to direct proper airflow, validate the configuration of the power supply, or provide alert message to the user of server 400.

Figure 10:
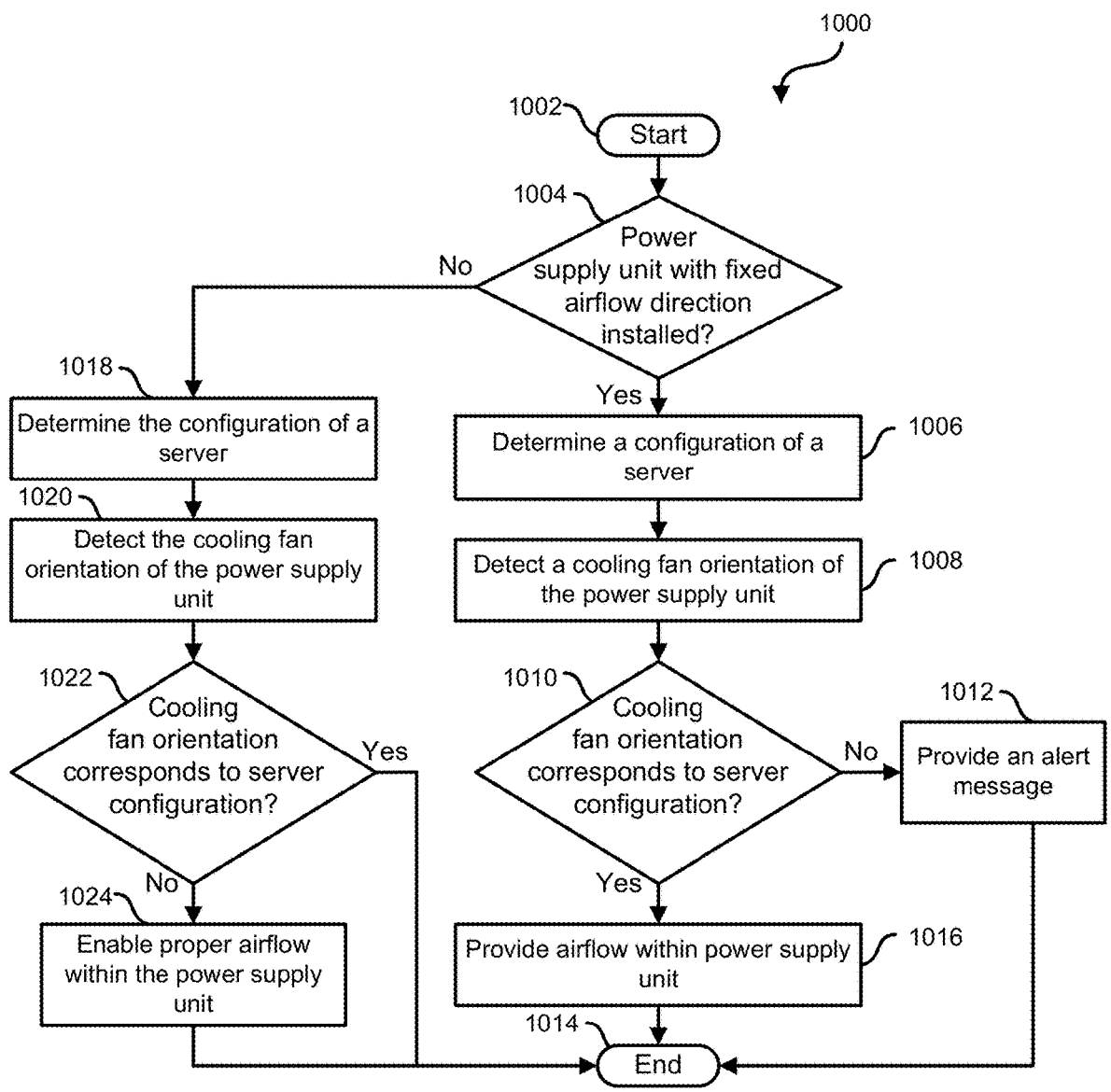
FIG. 10 is a flow diagram of a method for verifying a power supply unit is installed within an information handling system according to at least one embodiment of the disclosure.

FIG. 10 illustrates a flow diagram of a method 1000 for verifying a power supply unit is installed within an information handling system according to at least one embodiment of the disclosure, starting at block 1002. It will be readily appreciated that not every method step set forth in this flow diagram is always necessary, and that certain steps of the methods may be combined, performed simultaneously, in a different order, or perhaps omitted, without varying from the scope of the disclosure. FIG. 10 may be employed in whole, or in part, by information handling system 100 depicted in FIG. 1, or any other type of system, controller, device, module, processor, or any combination thereof, operable to employ all, or portions of, the method of FIG. 10.

At block 1004, a determination is made whether a power supply cooling fan of the power supply unit installed within the information handling system has a fixed airflow direction or changeable airflow direction. In response to the power supply cooling fan having a fixed airflow direction, a configuration of the server is determined at block 1006. In an example, a processor, such as BMC, may perform one or more suitable operations to determine the configuration of the server. In an example, different sets of internal cables may be needed based on a cable length needed to connect the output power from power supply unit to the power ports of devices within the server. In certain examples each set of cables may have different characteristics, which may be utilized to determine the configuration of server.

At block 1008, a power supply cooling fan orientation of the power supply unit is determined. In an example, the power supply cooling fan orientation may be determined in any suitable manner including, but not limited to, determining a type of power supply unit installed within the server. In certain examples, the type of power supply unit may be any suitable type including, but not limited to, a power supply unit with power supply cooling fans 220 that can only direct airflow in a single direction within the power supply unit. The processor also may detect a type of power supply unit via any other suitable manner including, but not limited to, detecting a model number or a device number stored within power supply unit and detecting characteristics of the power supply unit.

At block 1010, a determination is made whether the power supply cooling fan orientation of the power supply unit corresponds to the server configuration. In an example, if power supply unit has a cooling fan that pushes airflow across the power supply unit and the power supply unit is installed in hot aisle edge of the server, a determination that a power supply unit with a corresponding power supply cooling fan orientation is installed within the server. If power supply unit has a power supply cooling fan that pulls airflow across the power supply unit and the power supply unit is installed in a hot aisle edge of the server, a determination is that the power supply cooling fan orientation does not match the server configuration and a different power supply unit needs to be installed within the server. In response to the power supply cooling fan orientation not corresponding to the server configuration, an alert may be provided to a user of the server that a configuration error has occurred at block 1012 and the flow ends at block 1014. In an example, the alert may be any suitable message including, but not limited to, a message displayed on a screen associated with the server and an audio message.

If the power supply cooling fan orientation corresponds to the server configuration, airflow is provided within the power supply at block 1016, and the flow ends at block 1014. In an example, if power supply unit has a power supply cooling fan that pushes airflow across the power supply unit and the power supply unit is installed in the cold aisle edge of the server, a determination that a power supply unit with a corresponding power supply cooling fan orientation is installed within the server. If power supply unit has a power supply cooling fan that pulls airflow across the power supply unit and the power supply unit is installed in a cold aisle edge of the server, a determination is that the power supply cooling fan orientation corresponds to the server configuration. In an example, the correct direction of airflow for the power supply unit may be from a cold aisle edge to a hot aisle edge of the server.

If at block 1004, the power supply cooling fan has a changeable airflow direction, a configuration of the server is determined at block 1018. At block 1020, a power supply cooling fan orientation of the power supply unit is determined. In an example, the power supply cooling fan orientation may be determined in any suitable manner including, but not limited to, determining an airflow direction setting for the cooling fan of the power supply unit.

At block 1022, a determination is made whether the power supply cooling fan orientation of the power supply unit corresponds to the server configuration. In an example, if power supply unit cooling fan is in a setting that pushes airflow across the power supply unit and the power supply unit is installed in hot aisle edge of the server, a determination that a power supply unit with a corresponding power supply cooling fan orientation is installed within the server. If power supply unit power supply cooling fan is in a setting that pulls airflow across the power supply unit and the power supply unit is installed in a hot aisle edge of the server, a determination is that the power supply cooling fan orientation does not match the server configuration and a different airflow direction setting needs to be set.

In response to the power supply cooling fan orientation not corresponding to the server configuration, a proper airflow direction setting is enabled at block 1024, and the flow ends at block 1014. If the power supply cooling fan orientation corresponds to the server configuration, the flow ends at block 1014. If the power supply cooling fan orientation indicates that the cooling fan can change airflow directions within the power supply unit, the power supply cooling fan orientation may always match the server configuration, and the cooling fan is controlled to direct airflow in the correct direction.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a chassis including a cold aisle edge and a hot aisle edge;
one or more devices inserted within the cold aisle edge;
a plurality of cooling fans located along the hot aisle edge, wherein the plurality of cooling fans have a first fixed airflow direction to pull a first airflow from the cold aisle edge across the one or more devices and out the hot aisle edge;
a power supply unit including a power supply cooling fan located within a housing of the power supply unit, the power supply unit to provide power to the one or more devices, the power supply cooling fan to provide a second airflow through the power supply unit and not across the one or more devices; and
a baseboard management controller to:
determine whether the power supply cooling fan of the power supply unit installed within the information handling system has a fixed airflow direction or changeable airflow direction;
in response to the power supply cooling fan having the fixed airflow direction, the baseboard management controller to:
determine a configuration of the information handling system, wherein the configuration of the information handling system includes a location of the power supply unit along the cold aisle edge or along the hot aisle edge;

determine a power supply cooling fan orientation of the power supply cooling fan within the power supply unit;

determine whether the power supply cooling fan orientation corresponds to the configuration of the information handling system, wherein the power supply cooling fan orientation corresponds to the configuration of the information handling system when the power supply cooling fan moves the second airflow within the power supply unit from the cold aisle edge to the hot aisle edge;

in response to the power supply cooling fan orientation corresponding to the configuration of the information handling system, provide the second airflow within the power supply unit; and in response to the power supply cooling fan orientation not corresponding to the configuration of the information handling system, provide an alert message to an individual associated with the information handling system.

2. The information handling system of claim 1, wherein the determination of the power supply cooling fan orientation, the baseboard management controller further to determine whether the power supply cooling fan only pulls the second airflow across the power supply unit, or the power supply cooling fan only pushes the second airflow across the power supply unit.

3. The information handling system of claim 1, wherein in response to the power supply cooling fan having the changeable airflow direction, the baseboard management controller further to determine that the power supply cooling fan pushes the second airflow in a first setting and pulls the second airflow in a second setting.

4. The information handling system of claim 3, wherein in response to the power supply unit being installed within the cold aisle edge, the baseboard management controller to enable a proper airflow direction within the power supply unit by setting the power supply cooling fan in the second setting to pull the second airflow across the power supply unit.

5. The information handling system of claim 1, wherein the determining of whether the power supply cooling fan orientation corresponds to the configuration of the information handling system and in response to the power supply unit being installed within the cold aisle edge and the power supply cooling fan only pushes the second airflow across the power supply, the baseboard management controller further to determine that the power supply cooling fan orientation does not match the configuration of the information handling system.

6. The information handling system of claim 1, wherein the determining of whether the power supply cooling fan orientation corresponds to the configuration of the information handling system and in response to the power supply unit being installed within the cold aisle edge and the power supply cooling fan only pulling the second airflow across the power supply, the baseboard management controller to determine that the power supply cooling fan orientation corresponds to the configuration of the information handling system.

7. The information handling system of claim 1, wherein the determination of the configuration of the information handling system, the baseboard management controller further to determine a model number of the power supply unit.

8. The information handling system of claim 1, wherein the determination of the configuration of the information handling system, the baseboard management controller to determine one or more characteristics of power cables connected between the power supply unit and a device in the information handling system.

9. A method comprising:

pulling, by a plurality of cooling fans of a server, a first airflow from a cold aisle edge of the server across one or more devices and out a hot aisle edge of the server, wherein the plurality of cooling fans have a first fixed airflow direction;

determining, by a baseboard management controller of the server, whether a power supply cooling fan located within a housing of a power supply unit installed within the server has a fixed airflow direction or changeable airflow direction, the power supply cooling fan to provide a second airflow through the power supply unit and not across the one or more devices;

in response to the power supply cooling fan having the fixed airflow direction:

determining a configuration of the server, wherein the configuration of the server includes a plurality of cooling fans located along a hot aisle edge of the server, and a location of the power supply unit along a cold aisle edge or along the hot aisle edge;

determining a power supply cooling fan orientation of the power supply cooling fan within the power supply unit;

determining whether the power supply cooling fan orientation corresponds to the configuration of the server, wherein the power supply cooling fan orientation corresponds to the configuration of the information handling system when the power supply cooling fan moves the second airflow within the power supply unit from the cold aisle edge to the hot aisle edge;

in response to the power supply cooling fan orientation corresponding to the configuration of the server, providing the second airflow within the power supply unit; and in response to the power supply cooling fan orientation not corresponding to the configuration of the server, providing an alert message to an individual associated with the server.

10. The method of claim 9, wherein the determining of the power supply cooling fan orientation, the method further comprises:

determining whether the power supply cooling fan only pulls airflow across the power supply unit or the power supply cooling fan only pushes the second airflow across the power supply unit.

11. The method of claim 9, wherein in response to the power supply cooling fan having the changeable airflow direction, the method further comprises:

determining that the power supply cooling fan pushes the second airflow in a first setting and pulls the airflow in a second setting.

12. The method of claim 11, wherein in response to the power supply unit being installed within the cold aisle edge, the method further comprises:

enabling a proper airflow direction within the power supply unit by setting the power supply cooling fan in the second setting to pull the second airflow within the power supply unit.

13. The method of claim 9, wherein the determining of whether the power supply cooling fan orientation corresponds to the configuration of the server, the method further comprises:

in response to the power supply unit being installed within the cold aisle edge and the power supply cooling fan only pushes the second airflow within the power supply, determining that the power supply cooling fan orientation does not match the configuration of the server.

14. The method of claim 9, wherein the determining of whether the power supply cooling fan orientation corresponds to the configuration of the server, the method further comprises:

in response to the power supply unit being installed within the cold aisle edge and the power supply cooling fan only pulling the second airflow within the power supply, determining that the power supply cooling fan orientation corresponds to the configuration of the server.

15. The method of claim 9, wherein the determining of the configuration of the server, the method further comprises:

determining a model number of the power supply unit.

16. The method of claim 9, wherein the determining of the configuration of the server, the method further comprises:

determining one or more characteristics of power cables connected between the power supply unit and a device in the server.

\* \* \* \* \*